United States Patent [19]

Iijima et al.

[11] Patent Number: 4,660,002
[45] Date of Patent: Apr. 21, 1987

[54] HIGH FREQUENCY OSCILLATOR USING A DIODE FOR FREQUENCY SWITCHING AND FM MODULATION

[75] Inventors: Kouta Iijima; Takeshi Tanemura, both of Soma, Japan

[73] Assignee: Alps Electric Co., Ltd., Japan

[21] Appl. No.: 840,321

[22] Filed: Mar. 14, 1986

[30] Foreign Application Priority Data

Mar. 14, 1985 [JP] Japan .............................. 60-36386[U]

[51] Int. Cl.$^4$ .......................... H03B 5/18; H03C 3/22
[52] U.S. Cl. .............................. 332/16 T; 331/117 D;
331/177 V; 331/179; 332/30 V; 455/87;
455/111; 455/113
[58] Field of Search .......................... 332/16 T, 30 V;
331/117 D, 177 V, 179, 107 SL; 455/42, 86, 87,
111, 113

[56] References Cited

U.S. PATENT DOCUMENTS 4,140,982  2/1979  Alexander .......................... 332/31 T
4,353,038  10/1982  Rose et al. ..................... 332/30 V X
4,375,621  3/1983  Schneiter et al. ................. 332/16 T Primary Examiner—Siegfried H. Grimm
Attorney, Agent, or Firm—Guy W. Shoup

[57] ABSTRACT

A high frequency oscillator having an oscillation transistor connected to a resonant strip line unit consisting of a main strip line member and an auxiliary strip line member. The auxiliary strip line member is connected in parallel with or isolated from the main strip line member by a switch diode for switching the characteristic impedance of the strip line unit so as to generate a reception or transmission carrier wave output. A varactor diode connected to the strip line unit has its capacitance changed through an applied control voltage for channel switching. A modulating signal input terminal is directly connected to a portion of the auxiliary strip line member for modulating an FM transmission signal independently of the value of the control voltage applied to the varactor diode.

1 Claim, 2 Drawing Figures

HIGH FREQUENCY OSCILLATOR USING A DIODE FOR FREQUENCY SWITCHING AND FM MODULATION

TECHNICAL FIELD

This invention relates to a high frequency oscillator for use in radiocommunication apparatus, and more particularly to a high frequency oscillator having a combined function of generating both transmission and reception carrier waves of different frequencies and subjecting a transmission carrier wave to FM modulation.

BACKGROUND OF THE INVENTION

There is known, for example, a high frequency oscillator having a function of subjecting a transmission carrier wave to FM modulation, as shown in FIG. 2, in which a reference character Q designates a transistor for oscillation. The basic structure of the high frequency oscillator is composed of a transistor Q; a resonant strip line unit 3 consisting of a main strip line member 1 and an auxiliary strip line member 2; two terminal capacitors $C_1$, $C_2$ connected to the terminals of the strip line unit 3; a varactor diode VD connected to the auxiliary strip line member 2; and a switch diode for switching the characteristic impedance of the strip line unit 3. Of the auxiliary strip line member 2, one terminal is connected exclusively for passing high frequency waves (referred to as "high-pass-connected" hereinafter) to the main strip line member 1 through a capacitor $C_3$, and the other terminal through the switch diode "D". The cathode of the switch diode D is connected to a supply power input terminal 4 through a preset negative bias introducing component consisting of resistors $R_1$, $R_2$. The anode of the switch diode D is connected to the positive-bias switchable voltage input terminal 5 through a choke $L_1$. To the varactor diode VD, a regulation capacitor $C_4$ is connected in series. The series connection line is connected in parallel to a terminal capacitor $C_2$. Of the varactor diode VD, the cathode is connected to the control voltage input terminal 6 through a choke $L_2$ and the anode to a modulating-signal input terminal 7 through a modulation resistor $R_3$ and another capacitor $C_5$. The anode of the varactor diode VD is grounded through a parallel circuit of another resistor $R_4$ and a bypass capacitor $C_6$. Reference characters $C_7$, $C_8$, $C_9$ and $C_{10}$ designate bypass capacitors.

Of the main strip line number 1, one terminal is connected to the collector of the transistor Q through a capacitor $C_{11}$ and the other terminal to the output terminal 8 through a coupling capacitor $C_{12}$. Reference characters designate respectively: $R_5$, $R_6$, bias resistors of the transistor Q; $C_{13}$, a bypass capacitor; $R_7$, an emitter resistor; $C_{14}$, $C_{15}$, feedback capacitors; and $R_8$, a damper resistor.

Upon application of a H-level voltage to the switch voltage input terminal 5, the switch diode D is positively biased to turn "on", and thus the auxiliary strip line member 2 becomes connected in parallel to the main strip line member 1, leading to reduction of the characteristic impedance of the strip line unit 3, and an increase in oscillation frequency, and as the result a receiving carrier wave which is a first frequency signal is output from the output terminal 8.

On the other hand, upon application of a L-level voltage to the switchable voltage input terminal 5, the auxiliary strip line member 2 is isolated from the main strip line member 1, by the action of the negative bias of the switch diode D caused by +B voltage, which is applied to the supply power input terminal 4. In this way, oscillation of a diminished frequency is caused exclusively through the characteristic impedance of the main strip line member 1, and so a second-frequency signal or transmission carrier wave is generated from the output terminal 8.

When a reception or transmission carrier wave is being output, upon application of a control voltage to terminal 6, the capacitance of the varactor diode VD is changed and as the result, channel switching is caused during reception/transmission. Besides, during transmission, a modulating signal is input to the modulating signal input terminal 7, and the capacitance of the varactor diode VD is caused to change in accordance with the modulating signal to subject directly the transmission carrier wave to FM modulation.

With the prior art high frequency oscillator, for the purpose of channel switching, capacitance values of the varactor diode VD are separately set by the application of control voltages of desired values to the varactor diode VD. In addition, during transmission, a modulating signal is applied to the varactor diode VD and the capacitance is caused to change in response to a modulating signal in order to subject the transmission carrier wave directly to FM modulation.

Now, the characteristic of the control voltage to capacitance of the varactor diode is nonlinear. This brings the problem that though the level of a modulating signal applied at the modulating-signal input terminal 7 is constant, change in capacitance responsive to the modulating signal is dependent on the value of control voltage applied to the varactor diode VD, resulting in change in FM modulation degree. Another problem is that owing to application of a modulating signal after it has been superimposed on a control voltage, the circuit section to which the modulating signal is to be applied is required to include circuit elements such as capacitors $C_5$, $C_6$ and a resistor $R_4$. A high frequency oscillator circuit of this type needs to be miniaturized and compact, and therefore the increase in the number of parts and in turn the increased difficulty of construction is disadvantageous.

SUMMARY OF THE INVENTION

It is the principal object of the invention to solve the above-mentioned problems with the prior art and thus to provide a high frequency oscillator ensuring a constant modulation degree, and having a minimized number of parts.

These objects can be achieved by a high frequency oscillator according to the invention comprising a resonant strip line unit consisting of a main strip line member and an auxiliary strip line member of which one terminal is high-pass connected and the other terminal is connected through a switch diode for switching the characteristic impedance of the strip line unit to the main strip line; and adapted for generating first-frequency and second-frequency signals at on- and off-conditions of the switch diode, respectively, the switch diode being further provided with a modulating signal input terminal, and upon application of a modulating signal to the modulating signal input terminal at the off-position of the switch diode, the second frequency signal being subjected to FM modulation.

The application of the modulating signal to the switching diode connected to one terminal to the main strip line member at the negative bias ensures that change in capacitance of the switch diode is constant every time and in turn FM modulation degree can be kept constant.

DESCRIPTION OF PREFERRED EMBODIMENTS

Figure 1:
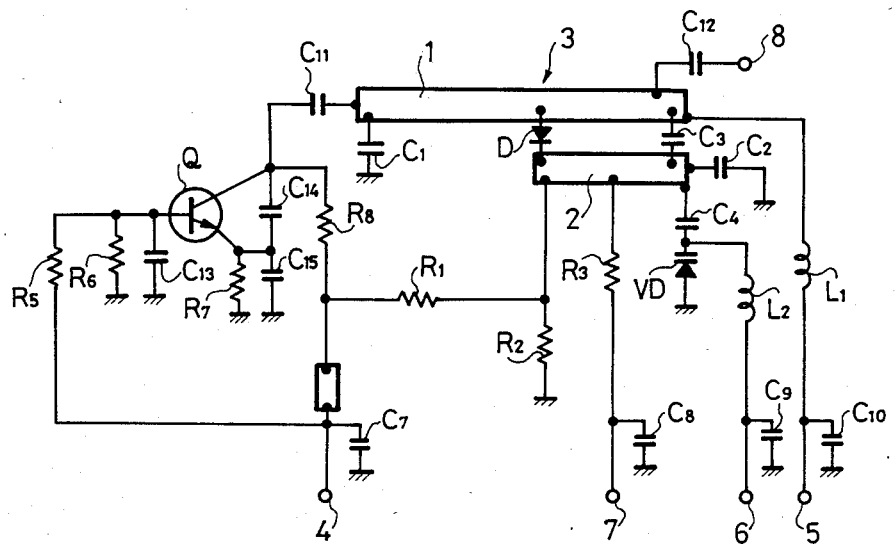
FIG. 1 is a circuit diagram of an embodiment of a high frequency oscillator according to the invention.
Figure 2:
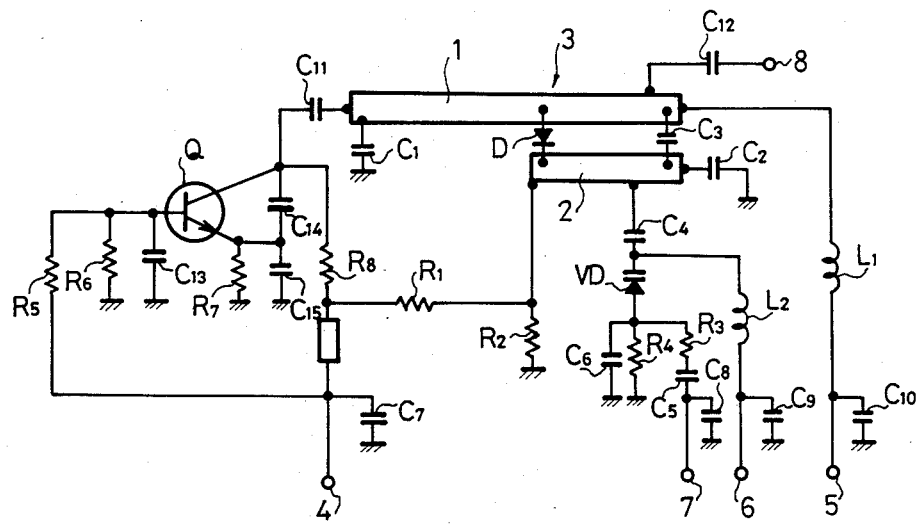
FIG. 2 is a circuit diagram of a prior art high frequency oscillator.

The invention will be more fully described by way of an example with reference to FIG. 1 hereinafter. The identical or equivalent circuit elements or components in FIG. 1 to those in FIG. 2, are designated by the same reference characters, and another description of these is omitted.

Now the construction of the invention will be described, in which the modulating signal input terminal 7 is connected to the cathode of a switch diode D through a modulation resistor $R_3$ and a part of the auxiliary strip line member 2. The connection line section to the modulating signal input terminal 7 includes only a bypass capacitor $C_8$, with omission of resistor $R_4$ and two capacitors $C_5$ and $C_6$ compared with that in FIG. 2.

The following description will be given of the mode of operation when only a transmission carrier wave is being out-put. When an L-level voltage is applied to the switchable-voltage input terminal 5, the switch diode D is subjected to negative bias due to a +B voltage applied to the supply power input terminal 4, so that the auxiliary strip line member 2 is isolated from the main strip line member 1. Accordingly, the high frequency oscillator operates in accordance with only the characteristic impedance of the main strip line member 1 to output a transmission carrier wave as a second-frequency signal from the terminal 8. During this time, the switch diode D is kept at a constant capacitance value corresponding to a negative bias value. The switching diode D placed under such condition is supplied with a modulating signal applied to the modulating signal input terminal 7 and through the modulation resistor $R_3$. As the result, the capacitance of the switch diode D changes in response to the modulating signal. This change is always the same and is independent of the value of the control voltage applied to the varactor VD. Thus, the modulation characteristic of the transmission carrier wave is kept constant, and consequently subjected to always-stable FM modulation.

As described above, the invention has the feature: the modulating signal input terminal is connected to the characteristic impedance switching diode interposed between the main and auxiliary strip line members, and a modulating signal is applied to the modulating signal input terminal at the off-position of the switch diode, so that the change in capacitance of the switch diode in response to the modulating signal is the same every time, with the result of keeping the FM modulation constant. The further feature regarding the circuit configuration of applying a modulating signal to a switching diode permits the omission of several elements including capacitors and resistors, leading to reduction in the number of parts. These features are very advantageous for the realization of a high frequency oscillator which has a miniaturized and compact circuit configuration.

What is claimed is:

1. A high frequency oscillator comprising:
an oscillation transistor;
a resonant strip line unit connected at one end to said oscillation transistor, said strip line unit consisting of a main strip line member and an auxiliary strip line member, one terminal of said auxiliary strip line member being high-pass connected to one terminal of the main strip line member, and the other terminal of said auxiliary strip line member being connectable through a switch diode to said main strip line member to place said auxiliary strip line member in parallel with the main strip line member for switching the characteristic impedance of the strip line unit;
an output terminal connected to the other end of the strip line unit which is adapted to provide first-frequency and second-frequency output signals in accordance with switching of the switch diode to On and Off conditions, respectively;
a switchable voltage input terminal connected to said main strip line member for biasing said switch diode to the On or Off conditions in accordance with a switching voltage signal applied thereto;
a varactor diode having one terminal connected to a portion of said auxiliary strip line member and its other terminal connected to ground, said varactor diode being connected to a control voltage input terminal for changing the capacitance of said varactor diode for channel switching in accordance with a control voltage applied to said control voltage input terminal; and
a modulating signal input terminal directly connected to a portion of said auxiliary strip line member such that upon application of a modulating signal to the modulating signal input terminal during the Off condition of the switch diode, the second-frequency signal is subjected to FM modulation.

* * * * *